United States Patent
Cheah et al.

(10) Patent No.: US 6,627,517 B1
(45) Date of Patent: Sep. 30, 2003

(54) SEMICONDUCTOR PACKAGE WITH IMPROVED THERMAL CYCLING PERFORMANCE, AND METHOD OF FORMING SAME

(75) Inventors: Eng-Chew Cheah, San Jose, CA (US); Sidney Larry Anderson, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/715,362

(22) Filed: Nov. 17, 2000

Related U.S. Application Data

(60) Provisional application No. 60/169,733, filed on Dec. 8, 1999.

(51) Int. Cl.[7] ................................................ H01L 21/30
(52) U.S. Cl. ........................................ 438/455; 438/118
(58) Field of Search ............................... 438/118, 106, 438/107, 123, 124, 127, 455

(56) References Cited

U.S. PATENT DOCUMENTS

| | | | | |
|---|---|---|---|---|
| 5,086,018 A | * | 2/1992 | Conru et al. | 29/827 |
| 5,208,188 A | * | 5/1993 | Newman | 156/31 |
| 5,601,675 A | * | 2/1997 | Hoffmeyer et al. | 156/94 |
| 5,756,380 A | * | 5/1998 | Berg et al. | 438/126 |
| 6,072,243 A | * | 6/2000 | Nakanishi | 257/783 |
| 6,110,761 A | * | 8/2000 | Ahmad | 438/118 |
| 6,133,068 A | * | 10/2000 | Kinsman | 438/118 |

OTHER PUBLICATIONS

Kapton® Polyimide Film, Industry Specifications Bulletin PST–00–1, obtained at http://www.dupont.com/kapton/general/pstindustryspecs.pdf.*

* cited by examiner

*Primary Examiner*—John F. Niebling
*Assistant Examiner*—Christopher Lattin
(74) *Attorney, Agent, or Firm*—Pennie & Edmonds LLP

(57) ABSTRACT

A semiconductor package includes a relatively thin substrate epoxy attached to a packaging substrate, such as a lead frame. A relatively thick semiconductor epoxy is attached to a semiconductor. The relatively thin substrate epoxy and the relatively thick semiconductor epoxy are attached to one another forming a stack including the packaging substrate, the relatively thin substrate epoxy, the relatively thick semiconductor epoxy, and the semiconductor. A housing encloses the stack.

20 Claims, 1 Drawing Sheet

SEMICONDUCTOR PACKAGE WITH IMPROVED THERMAL CYCLING PERFORMANCE, AND METHOD OF FORMING SAME

This application claims priority to the U.S. Provisional Patent Application entitled, "Apparatus and Method for Packaging a Semiconductor," Serial No. 60/169,733, filed Dec. 8, 1999.

BRIEF DESCRIPTION OF THE INVENTION

This invention relates generally to the packaging of semiconductors. More particularly, this invention relates to a technique for packaging a semiconductor to improve thermal cycling performance.

BACKGROUND OF THE INVENTION

Semiconductors are placed in packages and are then subjected to a variety of electrical and thermal tests. The thermal tests typically entail exposing the package to a series of low and high temperatures, referred to as thermal cycles. For example, it is common to expect a packaged semiconductor to withstand at least 1000 thermal cycles between 1 and 100° C. Additional thermal cycles typically cause damage to the semiconductor. This damage arises largely from the mechanical stress placed on the semiconductor. This mechanical stress stems from the mismatch in the thermal coefficients of expansion between the semiconductor, the substrate upon which it is mounted, and the epoxy bonding it to the substrate.

In view of the foregoing, it would be highly desirable to improve the thermal cycling performance of packaged semiconductors. Preferably, the technique would be low cost and would rely upon known packaging techniques.

SUMMARY OF THE INVENTION

The method of the invention is a process for packaging a semiconductor. The method includes dispensing a substrate epoxy onto a packaging substrate. A semiconductor epoxy is then applied to a semiconductor. The substrate epoxy is then engaged with the semiconductor epoxy.

A semiconductor package of the invention includes a relatively thin substrate epoxy attached to a packaging substrate, such as a lead frame. A relatively thick semiconductor epoxy is attached to a semiconductor. The relatively thin substrate epoxy and the relatively thick semiconductor epoxy are attached to one another, forming a stack including the packaging substrate, the relatively thin substrate epoxy, the relatively thick semiconductor epoxy, and the semiconductor. A housing encloses the stack.

The relatively thick semiconductor epoxy forms a compliant interface that reduces the stress imposed upon the semiconductor during thermal cycling. Thus, the package of the invention leads to extended semiconductor life. The relatively thick semiconductor epoxy is easily applied to the semiconductor in a separate process using standard techniques, such as spinning. Advantageously, the substrate epoxy may be applied to the substrate in accordance with prior art techniques, thereby preventing any alteration in prior art package assembly techniques. The substrate epoxy provides adhesion to the semiconductor epoxy, which may be in a cured state. Since the invention relies upon known packaging techniques, the invention can be implemented relatively easily at low cost.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
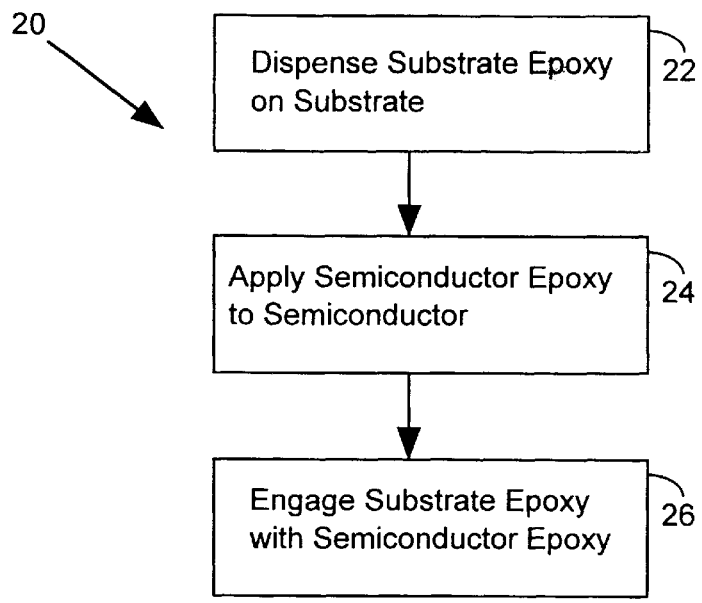
FIG. 1 illustrates processing steps performed in accordance with an embodiment of the invention.

FIG. 1 illustrates a process 20 performed in accordance with an embodiment of the invention. The process 20 includes the step of dispensing a substrate epoxy on a substrate (step 22). The substrate epoxy may be a standard conductive or nonconductive epoxy, depending upon the application. Typically, the substrate epoxy is machine dispensed onto a substrate, which is implemented as a lead frame. The substrate epoxy is relatively thin, typically on the order of approximately 2 mils or less.

The next processing step is to apply semiconductor epoxy to a semiconductor (step 24). The semiconductor epoxy is a standard conductive or non-conductive epoxy, depending upon the application. The semiconductor epoxy may be spun onto the semiconductor to form a relatively thick layer, typically on the order of approximately 5 mils or more. The epoxy is then cured in wafer form, using well known techniques.

The sequence of steps 22 and 24 is not important. Thus, in many applications it will be preferable to apply semiconductor epoxy to a semiconductor (step 24) prior to applying substrate epoxy to the substrate (step 22). The epoxy used in each step (i.e., step 22 and step 24) may be the same epoxy; thus, the term semiconductor epoxy refers to an epoxy on a semiconductor, while the term substrate epoxy refers to an epoxy on a substrate. By way of example, the epoxy may be any number of die attach adhesives sold by ABELSTIK LABORATORIES®, Rancho Dominguez, Calif.

The invention utilizes a relatively thin substrate epoxy and relatively thick semiconductor epoxy, meaning that the relatively thick semiconductor epoxy is approximately 2.5 times or more thicker than the relatively thin substrate epoxy. Those skilled in the art will appreciate that the relatively thick semiconductor epoxy is readily applied to a semiconductor in a separate process, but would be relatively difficult to apply to the substrate, causing alterations in standard processing techniques and leading to assembly mess.

The final processing step illustrated in FIG. 1 is to engage the substrate epoxy with the semiconductor epoxy (step 26). The substrate epoxy provides adhesion to the semiconductor epoxy, which is typically in a cured state.

Figure 2:
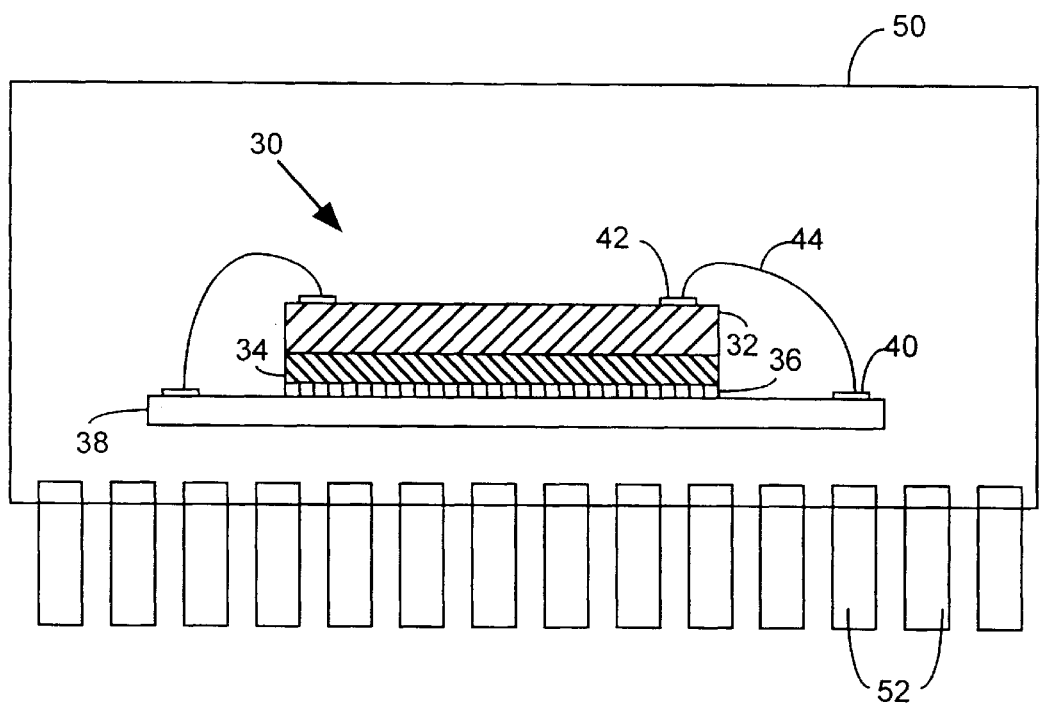
FIG. 2 illustrates a semiconductor package in accordance with an embodiment of the invention.

FIG. 2 illustrates a semiconductor stack 30 constructed in accordance with an embodiment of the invention. The stack 30 includes a semiconductor 32 with a semiconductor epoxy 34 attached to it. The figure also illustrates a substrate epoxy 36 attached to a substrate 38. Substrate bond pads 40 are positioned on the substrate 38. Semiconductor bond pads 42 are positioned on the semiconductor 32. Bond wires 44 link the semiconductor bond pads 42 to the substrate bond pads 40. The bond wires 44 may be applied using standard techniques after the processing of FIG. 1 is completed. Additionally, the stack 30 may be positioned in a housing 50, which includes pins 52. By way of example, the housing 50 may be an injected molded plastic housing.

Those skilled in the art will recognize a number of advantages associated with the technique of the invention.

The relatively thick semiconductor epoxy reduces the stress imposed upon the semiconductor during thermal cycling. Thus, the package of the invention leads to extended semiconductor life. The relatively thick semiconductor epoxy is easily applied to the semiconductor in a separate process using standard techniques, such as spinning. Advantageously, the substrate epoxy, operating as an adhesion layer, may be applied to the substrate in accordance with prior art techniques, thereby preventing any alteration in prior art package assembly techniques. Since the invention relies upon known packaging techniques, the invention can be implemented relatively easily at low cost.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of packaging a semiconductor, comprising:
   applying a semiconductor epoxy to a semiconductor;
   dispensing a substrate epoxy onto a packaging substrate; and
   engaging said substrate epoxy with said semiconductor epoxy wherein said semiconductor epoxy is cured before it is engaged with said substrate epoxy.

2. The method of claim 1 wherein said applying includes applying a relatively thick layer of semiconductor epoxy to said semiconductor.

3. The method of claim 2 wherein said applying includes applying approximately 5 mils or more of semiconductor epoxy to said semiconductor.

4. The method of claim 1 wherein said applying includes applying said semiconductor epoxy to said semiconductor by spinning.

5. The method of claim 1 wherein said applying includes curing said semiconductor epoxy.

6. The method of claim 1 wherein said dispensing includes dispensing a relatively thin layer of substrate epoxy onto said packaging substrate.

7. The method of claim 6 wherein said dispensing includes dispensing approximately 2 mils or less of substrate epoxy onto said packaging substrate.

8. The method of claim 1 wherein said dispensing includes machine dispensing said substrate epoxy onto a lead frame.

9. The method of claim 1 wherein said dispensing results in a substrate epoxy layer and said applying results in a semiconductor epoxy layer that is approximately 2.5 times or more thicker than said substrate epoxy layer.

10. The method of claim 1 further comprising wire bonding said semiconductor to said packaging substrate.

11. The method of claim 10 further comprising enclosing said packaging substrate and said semiconductor in a housing.

12. The method of claim 11 wherein said housing is an injection molded plastic housing.

13. A method of packaging a semiconductor, comprising:
    applying a layer of semiconductor epoxy to a semiconductor, said layer being more than 5 mils thick;
    dispensing a substrate epoxy onto a packaging substrate; and
    engaging said substrate epoxy with said semiconductor epoxy.

14. The method of claim 13 wherein said applying includes applying said semiconductor epoxy to said semiconductor by spinning.

15. The method of claim 13 wherein said applying includes curing said semiconductor epoxy.

16. The method of claim 13 wherein said dispensing includes machine dispensing said substrate epoxy onto a lead frame.

17. The method of claim 13 wherein said dispensing results in a substrate epoxy layer and said applying results in a semiconductor epoxy layer that is approximately 2.5 times or more thicker than said substrate epoxy layer.

18. A method of packaging a semiconductor, comprising:
    dispensing a layer of substrate epoxy onto a packaging substrate, said layer being approximately 2 mils thick or less;
    applying a semiconductor epoxy to a semiconductor; and
    engaging said substrate epoxy with said cured semiconductor epoxy wherein said semiconductor epoxy is cured before it is engaged with said substrate epoxy.

19. The method of claim 18 wherein said dispensing includes machine dispensing said substrate epoxy onto a lead frame.

20. The method of claim 18 wherein said applying includes curing said semiconductor epoxy.

* * * * *